United States Patent
Okuno et al.

(10) Patent No.: US 10,128,513 B2
(45) Date of Patent: Nov. 13, 2018

(54) POROUS METAL BODY AND METHOD FOR PRODUCING POROUS METAL BODY

(71) Applicants: SUMITOMO ELECTRIC INDUSTRIES, LTD., Osaka-shi, Osaka (JP); SUMITOMO ELECTRIC TOYAMA CO., LTD., Imizu-shi, Toyama (JP)

(72) Inventors: Kazuki Okuno, Hyogo (JP); Masahiro Kato, Hyogo (JP); Tomoyuki Awazu, Hyogo (JP); Masatoshi Majima, Hyogo (JP); Kengo Tsukamoto, Toyama (JP); Hitoshi Tsuchida, Toyama (JP); Hidetoshi Saito, Toyama (JP)

(73) Assignees: SUMITOMO ELECTRIC INDUSTRIES, LTD., Osaka-shi, Osaka (JP); SUMITOMO ELECTRIC TOYAMA CO., LTD., Imizu-shi, Toyama (JP)

( * ) Notice: Subject to any disclaimer, the term of this patent is extended or adjusted under 35 U.S.C. 154(b) by 294 days.

(21) Appl. No.: 15/123,333

(22) PCT Filed: Feb. 20, 2015

(86) PCT No.: PCT/JP2015/054804
§ 371 (c)(1),
(2) Date: Sep. 2, 2016

(87) PCT Pub. No.: WO2015/133296
PCT Pub. Date: Sep. 11, 2015

(65) Prior Publication Data
US 2017/0069918 A1     Mar. 9, 2017

(30) Foreign Application Priority Data

Mar. 6, 2014 (JP) .................................. 2014-044071

(51) Int. Cl.
*H01M 8/0232* (2016.01)
*C25D 1/08* (2006.01)
(Continued)

(52) U.S. Cl.
CPC ......... *H01M 8/0232* (2013.01); *B22F 3/1121* (2013.01); *B22F 3/1146* (2013.01);
(Continued)

(58) Field of Classification Search
None
See application file for complete search history.

(56) References Cited

U.S. PATENT DOCUMENTS

2014/0335441 A1* 11/2014 Tsukamoto .............. C25D 5/50
429/522

FOREIGN PATENT DOCUMENTS

JP      S55-18579 A     2/1980
JP      H11-154517 A    6/1999
(Continued)

*Primary Examiner* — Wojciech Haske
(74) *Attorney, Agent, or Firm* — Drinker Biddle & Reath LLP

(57) ABSTRACT

An object of the present invention is to provide, at a low cost, a porous metal body that can be used in an electrode of a fuel cell and that has better corrosion resistance. The porous metal body has a three-dimensional mesh-like structure and contains nickel (Ni), tin (Sn), and chromium (Cr). A content ratio of the tin is 10% by mass or more and 25% by mass or less, and a content ratio of the chromium is 1% by mass or more and 10% by mass or less. On a cross section of a skeleton of the porous metal body, the porous metal body contains a solid solution phase of chromium, nickel, and tin. The solid solution phase contains a solid solution phase of chromium and trinickel tin ($Ni_3Sn$), the solid solution phase having a chromium content ratio of 2% by mass or less, and does not contain a solid solution phase that (Continued)

is other than a solid solution phase of chromium and trinickel tin (Ni$_3$Sn) and that has a chromium content ratio of less than 1.5% by mass.

9 Claims, 2 Drawing Sheets

(51) Int. Cl.
    *C25D 5/12*     (2006.01)
    *C25D 5/50*     (2006.01)
    *C22C 1/08*     (2006.01)
    *C22C 21/08*     (2006.01)
    *B22F 3/11*     (2006.01)
    *C25D 3/12*     (2006.01)
    *C25D 5/54*     (2006.01)
    *C22F 1/10*     (2006.01)
    *C22F 1/11*     (2006.01)
    *C23C 14/20*     (2006.01)
    *C23C 24/00*     (2006.01)
    *C25D 3/30*     (2006.01)
    *C25D 5/56*     (2006.01)
    *H01G 11/68*     (2013.01)
    *H01G 11/70*     (2013.01)
    *H01M 4/80*     (2006.01)
    *C22C 19/05*     (2006.01)
    *H01M 8/1018*     (2016.01)
    *C25D 3/32*     (2006.01)
    *C23C 18/16*     (2006.01)
    *C23C 18/30*     (2006.01)
    *C23C 18/36*     (2006.01)

(52) U.S. Cl.
    CPC ............... *C22C 1/08* (2013.01); *C22C 19/058* (2013.01); *C22C 21/08* (2013.01); *C22F 1/10* (2013.01); *C22F 1/11* (2013.01); *C23C 14/205* (2013.01); *C23C 24/00* (2013.01); *C25D 1/08* (2013.01); *C25D 3/12* (2013.01); *C25D 3/30* (2013.01); *C25D 5/12* (2013.01); *C25D 5/50* (2013.01); *C25D 5/505* (2013.01); *C25D 5/54* (2013.01); *C25D 5/56* (2013.01); *H01G 11/68* (2013.01); *H01G 11/70* (2013.01); *H01M 4/80* (2013.01); *C23C 18/1653* (2013.01); *C23C 18/30* (2013.01); *C23C 18/36* (2013.01); *C25D 3/32* (2013.01); *H01M 2008/1095* (2013.01)

(56) References Cited

FOREIGN PATENT DOCUMENTS

| | | |
|---|---|---|
| JP | 2012-132083 A | 7/2012 |
| JP | 2012-149282 A | 8/2012 |
| WO | WO-2013/099532 A1 | 7/2013 |
| WO | WO-2014/050536 A1 | 4/2014 |
| WO | WO-2014/203594 A1 | 12/2014 |

* cited by examiner

POROUS METAL BODY AND METHOD FOR PRODUCING POROUS METAL BODY

TECHNICAL FIELD

The present invention relates to a porous metal body that can be used as a current collector for a battery, a capacitor, a fuel cell, or the like and a method for producing the porous metal body.

BACKGROUND ART

A known method for producing a porous metal body having a high porosity and a large surface area is a method in which a metal layer is formed on a surface of a porous resin body such as a resin foam. For example, Japanese Unexamined Patent Application Publication No. 11-154517 (PTL 1) describes a method for producing a porous metal body, the method including subjecting a porous resin body to an electrical conduction treatment, forming an electroplating layer formed of a metal on the porous resin body, and optionally removing the porous resin body by incineration.

Japanese Unexamined Patent Application Publication No. 2012-132083 (PTL 2) proposes a porous metal body formed of a nickel-tin alloy as a porous metal body having oxidation resistance, corrosion resistance, and a high porosity and suitable for a current collector for a battery, a capacitor, a fuel cell, or the like. Furthermore, Japanese Unexamined Patent Application Publication No. 2012-149282 (PTL 3) proposes a porous metal body formed of a nickel-chromium alloy as a porous metal body having high corrosion resistance.

CITATION LIST

Patent Literature

PTL 1: Japanese Unexamined Patent Application Publication No. 11-154517
PTL 2: Japanese Unexamined Patent Application Publication No. 2012-132083
PTL 3: Japanese Unexamined Patent Application Publication No. 2012-149282

SUMMARY OF INVENTION

Technical Problem

In recent years, the realization of high output and high capacity (reduction in the size) has been increasingly desired for various batteries, capacitors, fuel cells, and the like. Accordingly, further improvements in oxidation resistance and corrosion resistance have also been desired for porous metal bodies that constitute current collectors. In particular, when the existing porous metal bodies are used in electrodes of fuel cells, a further improvement in corrosion resistance has been required because a strong acid is generated from a membrane electrode assembly (MEA).

In view of the problems described above, an object of the present invention is to provide, at a low cost, a porous metal body that can be used in an electrode of a fuel cell and that has better corrosion resistance.

Solution to Problem

In order to solve the problems described above, the present invention adopts the following configurations.

Specifically, a porous metal body according to an embodiment of the present invention is a porous metal body having a three-dimensional mesh-like structure and containing nickel (Ni), tin (Sn), and chromium (Cr). A content ratio of the tin is 10% by mass or more and 25% by mass or less, and a content ratio of the chromium is 1% by mass or more and 10% by mass or less. On a cross section of a skeleton of the porous metal body, the porous metal body contains a solid solution phase of chromium, nickel, and tin. The solid solution phase contains a solid solution phase of chromium and trinickel tin ($Ni_3Sn$), the solid solution phase having a chromium content ratio of 2% by mass or less, and does not contain a solid solution phase that is other than a solid solution phase of chromium and trinickel tin ($Ni_3Sn$) and that has a chromium content ratio of less than 1.5% by mass.

A method for producing a porous metal body according to another embodiment of the present invention is a method for producing a porous metal body having a three-dimensional mesh-like structure and containing nickel (Ni), tin (Sn), and chromium (Cr). The method for producing a porous metal body includes a step of subjecting a surface of a resin formed body having a three-dimensional mesh-like structure to an electrical conduction treatment by applying a conductivity-imparting material containing a chromium powder or a chromium oxide powder onto the surface of the resin formed body so that a content ratio of chromium in the porous metal body becomes 1% by mass or more and 10% by mass or less, a step of forming a resin structure by forming a nickel plating layer and a tin plating layer on the resin formed body so that a content ratio of tin in the porous metal body becomes 10% by mass or more and 25% by mass or less, a step of diffusing the chromium, the nickel, and the tin by heat-treating the resin structure at 1,100° C. or more for 5 minutes or more, and a step of performing cooling at a rate of higher than 30° C./min until a temperature of the porous metal body after the heat treatment becomes at least 550° C. or less.

A method for producing a porous metal body according to another embodiment of the present invention is a method for producing a porous metal body having a three-dimensional mesh-like structure and containing nickel (Ni), tin (Sn), and chromium (Cr). The method for producing a porous metal body includes a step of subjecting a surface of a resin formed body having a three-dimensional mesh-like structure to an electrical conduction treatment, a step of forming a resin structure by forming a nickel plating layer, a tin plating layer, and a chromium plating layer on the resin formed body so that a content ratio of tin in the porous metal body becomes 10% by mass or more and 25% by mass or less and a content ratio of chromium in the porous metal body becomes 1% by mass or more and 10% by mass or less, a step of diffusing the nickel, the tin, and the chromium by heat-treating the resin structure at 1,100° C. or more for 5 minutes or more, and a step of performing cooling at a rate of higher than 30° C./min until a temperature of the porous metal body after the heat treatment becomes at least 550° C. or less.

Advantageous Effects of Invention

According to the present invention, a porous metal body that can be used in an electrode of a fuel cell and that has better corrosion resistance can be provided at a low cost.

DESCRIPTION OF EMBODIMENTS

Figure 1:
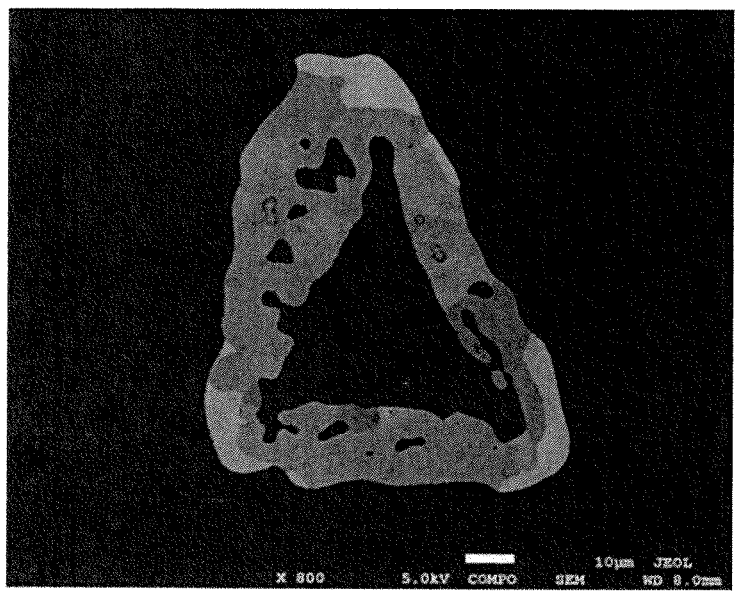
FIG. 1 is a view showing a photograph of results of an observation by a scanning electron microscope (SEM) and a composition analysis by energy dispersive X-ray spectrometry (EDX) for a cross section of a skeleton of Porous metal body 1 of an Example.

Description of Embodiments of the Present Invention

First, the contents of embodiments of the present invention will be listed and described.

(1) A porous metal body according to an embodiment of the present invention is a porous metal body having a three-dimensional mesh-like structure and containing nickel (Ni), tin (Sn), and chromium (Cr), in which a content ratio of the tin is 10% by mass or more and 25% by mass or less, a content ratio of the chromium is 1% by mass or more and 10% by mass or less, on a cross section of a skeleton of the porous metal body, the porous metal body contains a solid solution phase of chromium, nickel, and tin, and the solid solution phase contains a solid solution phase of chromium and trinickel tin ($Ni_3Sn$), the solid solution phase having a chromium content ratio of 2% by mass or less, and does not contain a solid solution phase that is other than a solid solution phase of chromium and trinickel tin ($Ni_3Sn$) and that has a chromium content ratio of less than 1.5% by mass.

Hereinafter, a "porous metal body having a three-dimensional mesh-like structure" may be simply referred to as "porous metal body".

The porous metal body described in (1) above has a low content ratio of a solid solution phase having low corrosion resistance (in particular, a phase having a low chromium content ratio, for example, NiSn), and thus is a porous metal body having very good corrosion resistance. Accordingly, for example, even when the porous metal body is used as a current collector for a polymer electrolyte fuel cell (PEFC), release of Ni can be prevented.

The porous metal body according to an embodiment of the present invention preferably contains tin in content ratio of 10% by mass or more and 25% by mass or less, chromium in a content ratio of 1% by mass or more and 10% by mass or less, and nickel as a residual metal component. However, the porous metal body may contain other metal components as inevitable impurities. The porous metal body may intentionally contain other components in a range that does not impair good corrosion resistance, which is an advantage of the porous metal body according to an embodiment of the present invention. Examples of the metal that is intentionally added to the porous metal body include titanium (Ti), copper (Cu), cobalt (Co), tungsten (W), iron (Fe), manganese (Mn), silver (Ag), and gold (Au).

In the porous metal body according to an embodiment of the present invention, the feature "on a cross section of a skeleton of the porous metal body, the porous metal body contains a solid solution phase of chromium, nickel, and tin, and the solid solution phase contains a solid solution phase of chromium and trinickel tin ($Ni_3Sn$), the solid solution phase having a chromium content ratio of 2% by mass or less, and does not contain a solid solution phase that is other than the solid solution phase of chromium and trinickel tin ($Ni_3Sn$) and that has a chromium content ratio of less than 1.5% by mass" is determined as follows.

Specifically, a cross section of the skeleton of the porous metal body is subjected to SEM-EDX analysis. In a back-scattered electron image of the SEM, the threshold of black/white binarization is appropriately set. A portion that continuously has the same contrast is defined as one phase, and thus the image is divided into respective phases. Subsequently, the composition analysis is performed by EDX in points at three positions in each phase. The concentrations of Ni, Sn, and Cr in the points are determined. The above feature means that, in this case, a point having a Cr content ratio of less than 1.5% by mass is not present in a solid solution phase of Ni, Sn, and Cr, the solid solution phase not including an intermetallic compound such as $Ni_3Sn$. The measurement of the porous metal body is performed on cross sections at three positions. The selection of the cross sections is not particularly limited as long as cross sections of the skeleton are clearly observed in the portions. However, the three positions are preferably disposed on both end portions of the porous metal body in the thickness direction and a middle portion between the end portions.

The magnification in the measurement by SEM is appropriately selected in a range from a magnification at which a cross section of the skeleton of the porous metal body is substantially included in the field of view to a magnification at which a phase to be measured is substantially included in the field of view. For example, when the porous metal body has an average cell size of 400 to 600 µm, the composition analysis of a cross section by SEM may be performed at a magnification of 500 to 10,000.

The measurement area (beam size) of the point analysis by EDX is set to be sufficiently smaller than the area of the phase to be measured. The area of the phase to be measured can be estimated from the contrast. The point analysis by EDX may be performed at an accelerating voltage of 3 to 10 kV.

(2) A porous metal body according to an embodiment of the present invention is the porous metal body described in (1) above, in which, on the cross section of the skeleton of the porous metal body, an area ratio of the solid solution phase of chromium and trinickel tin ($Ni_3Sn$), the solid solution phase having a chromium content ratio of 2% by mass or less, is 7% or more and 60% or less of a total area of the cross section of the skeleton.

The porous metal body described in (2) above has a high content ratio of $Ni_3Sn$, which has good corrosion resistance and good hardness, and thus is a porous metal body having good corrosion resistance and good mechanical strength.

(3) A porous metal body according to an embodiment of the present invention is the porous metal body described in (1) above, in which, on the cross section of the skeleton of the porous metal body, an area ratio of the solid solution phase of chromium and trinickel tin ($Ni_3Sn$), the solid solution phase having a chromium content ratio of 2% by mass or less, is less than 7% of a total area of the cross section of the skeleton.

The $Ni_3Sn$, which is an intermetallic compound, has a property that it has good corrosion resistance and good hardness but is relatively brittle. Therefore, the porous metal body described in (3) above, which has a low content ratio of the $Ni_3Sn$, is a porous metal body in which embrittlement of the skeleton is suppressed while having corrosion resistance.

(4) A method for producing a porous metal body according to an embodiment of the present invention is a method for producing a porous metal body having a three-dimensional mesh-like structure and containing nickel (Ni), tin (Sn), and chromium (Cr), the method including a step of subjecting a surface of a resin formed body having a three-dimensional mesh-like structure to an electrical conduction treatment by applying a conductivity-imparting material containing a chromium powder or a chromium oxide powder onto the surface of the resin formed body so that a content ratio of chromium in the porous metal body becomes 1% by mass or more and 10% by mass or less;

a step of forming a resin structure by forming a nickel plating layer and a tin plating layer on the resin formed body so that a content ratio of tin in the porous metal body becomes 10% by mass or more and 25% by mass or less;

a step of diffusing the chromium, the nickel, and the tin by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (4) above, the porous metal body described in any one of (1) to (3) above can be produced.

In the method for producing a porous metal body described in (4) above, since an electrical conduction treatment material containing a chromium oxide powder or a chromium powder is used in the electrical conduction treatment of the surface of the resin formed body, a subsequent step of forming a chromium plating layer is not necessary. Accordingly, a porous metal body can be provided at a lower cost. Note that a chromium powder is an insulator because the surface thereof is usually formed of chromium oxide. Therefore, the chromium powder is used as the electrical conduction treatment material in combination with an electrically conductive powder such as a carbon powder.

The order of the formation of the metal plating layers formed on the surface of the resin formed body is not limited. Either the nickel plating layer or the tin plating layer may be first formed. However, the porous metal body has a nickel content higher than a tin content. Accordingly, considering the handling of a base after plating, preferably, the nickel plating layer is first formed.

(5) A method for producing a porous metal body according to an embodiment of the present invention is a method for producing a porous metal body having a three-dimensional mesh-like structure and containing nickel (Ni), tin (Sn), and chromium (Cr), the method including a step of subjecting a surface of a resin formed body having a three-dimensional mesh-like structure to an electrical conduction treatment;

a step of forming a resin structure by forming a nickel plating layer, a tin plating layer, and a chromium plating layer on the resin formed body so that a content ratio of tin in the porous metal body becomes 10% by mass or more and 25% by mass or less and a content ratio of chromium in the porous metal body becomes 1% by mass or more and 10% by mass or less;

a step of diffusing the nickel, the tin, and the chromium by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (5) above, the porous metal body described in any one of (1) to (3) above can be produced.

In the method for producing a porous metal body described in (5) above, since all the metal components of nickel, tin, and chromium are formed by electrolytic plating, a continuous production can be realized. Accordingly, this method is a production method with good mass productivity. The order of the formation of the metal plating layers formed on the surface of the resin formed body is not limited. The nickel plating layer, the tin plating layer, and the chromium plating layer may be formed in any order.

However, the porous metal body has a nickel content higher than contents of tin and chromium. Accordingly, considering the handling of a base after plating, preferably, the nickel plating layer is first formed.

(6) A method for producing a porous metal body according to an embodiment of the present invention is the method for producing a porous metal body described in (4) or (5) above, in which, in the formation of the tin plating layer, the tin plating layer is formed so that a content ratio of tin in the porous metal body becomes 17% by mass or more.

By the method for producing a porous metal body described in (6) above, the porous metal body described in (2) above can be produced.

(7) A method for producing a porous metal body according to an embodiment of the present invention is the method for producing a porous metal body described in (4) or (5) above, in which, in the formation of the tin plating layer, the tin plating layer is formed so that a content ratio of tin in the porous metal body becomes less than 17% by mass.

By the method for producing a porous metal body described in (7) above, the porous metal body described in (3) above can be produced.

Furthermore, the porous metal body according to embodiments of the present invention can be obtained by the production methods described in (i) to (vi) below.

(i) A method for producing a porous metal body, the method including a step of subjecting a surface of a resin formed body having a three-dimensional mesh-like structure to an electrical conduction treatment by applying a conductivity-imparting material containing a tin powder onto the surface of the resin formed body so that a content ratio of tin in the porous metal body becomes 10% by mass or more and 25% by mass or less;

a step of forming a resin structure by forming a nickel plating layer and a chromium plating layer on the resin formed body so that a content ratio of chromium in the porous metal body becomes 1% by mass or more and 10% by mass or less;

a step of diffusing the tin, the nickel, and the chromium by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (i) above, the porous metal body described in any one of (1) to (3) above can be produced.

In the method for producing a porous metal body described in (i) above, since a conductivity-imparting material containing a tin powder is used in the electrical conduction treatment of the surface of the resin formed body, a subsequent step of forming a tin plating layer is not necessary. Accordingly, a porous metal body can be provided at a lower cost. Note that a tin powder usually has a large particle diameter, and particles thereof are unlikely to come in contact with each other. Therefore, the tin powder is preferably used as the conductivity-imparting material in combination with an electrically conductive powder having a small particle diameter, such as a carbon powder.

The order of the formation of the metal plating layers formed on the surface of the resin formed body is not limited. Either the nickel plating layer or the chromium plating layer may be first formed. However, the porous metal body has a nickel content higher than a chromium content. Accordingly, considering the handling of a base after plating, preferably, the nickel plating layer is first formed.

(ii) A method for producing a porous metal body, the method including a step of subjecting a surface of a resin formed body having a three-dimensional mesh-like structure to an electrical conduction treatment by applying a conductivity-imparting material containing a tin powder, and a chromium powder or a chromium oxide powder onto the surface of the resin formed body so that a content ratio of tin in the porous metal body becomes 10% by mass or more and 25% by mass or less and a content ratio of chromium becomes 1% by mass or more and 10% by mass or less;

a step of forming a resin structure by forming a nickel plating layer on the surface of the resin formed body;

a step of diffusing the tin, the chromium, and the nickel by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (ii) above, the porous metal body described in any one of (1) to (3) above can be produced.

In the method for producing a porous metal body described in (ii) above, since a conductivity-imparting material containing a tin powder, and a chromium powder or a chromium oxide powder is used in the electrical conduction treatment of the surface of the resin formed body, subsequent steps of forming a tin plating layer and forming a chromium plating layer are not necessary. That is, only a nickel plating layer may be formed on the surface of the resin formed body, and thus a plating step is performed only once. Accordingly, a porous metal body can be provided at a low cost. As described above, the conductivity-imparting material containing a tin powder, and a chromium powder or a chromium oxide powder is preferably used in combination with an electrically conductive powder having electrical conductivity and a small particle diameter, such as a carbon powder.

(iii) A method for producing a porous metal body, the method including a step of subjecting a surface of a resin formed body having a three-dimensional mesh-like structure to an electrical conduction treatment by sputtering chromium on the surface of the resin formed body so that a content ratio of chromium in the porous metal body becomes 1% by mass or more and 10% by mass or less;

a step of forming a resin structure by forming a nickel plating layer and a tin plating layer on the resin formed body so that a content ratio of tin in the porous metal body becomes 10% by mass or more and 25% by mass or less;

a step of diffusing the chromium, the nickel, and the tin by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (iii) above, the porous metal body described in any one of (1) to (3) above can be produced.

In the method for producing a porous metal body described in (iii) above, since the resin formed body is subjected to the electrical conduction treatment by sputtering chromium on the surface of the resin formed body, a subsequent step of forming a chromium plating layer is not necessary. Accordingly, a porous metal body can be provided at a lower cost.

The order of the formation of the metal plating layers formed on the surface of the resin formed body is not limited. Either the nickel plating layer or the tin plating layer may be first formed. However, the porous metal body has a nickel content higher than a tin content. Accordingly, considering the handling of a base after plating, preferably, the nickel plating layer is first formed.

(iv) A method for producing a porous metal body, the method including a step of subjecting a surface of a resin formed body having a three-dimensional mesh-like structure to an electrical conduction treatment by sputtering tin on the surface of the resin formed body so that a content ratio of tin in the porous metal body becomes 10% by mass or more and 25% by mass or less;

a step of forming a resin structure by forming a nickel plating layer and a chromium plating layer on the resin formed body so that a content ratio of chromium in the porous metal body becomes 1% by mass or more and 10% by mass or less;

a step of diffusing the tin, the nickel, and the chromium by heat-treating the resin structure at 1,100° C. or more for 5 minutes or more; and a step of performing cooling at a rate of higher than 30° C./min until a temperature of the porous metal body after the heat treatment becomes at least 550° C. or less.

By the method for producing a porous metal body described in (iv) above, the porous metal body described in any one of (1) to (3) above can be produced.

In the method for producing a porous metal body described in (iv) above, since the resin formed body is subjected to the electrical conduction treatment by sputtering tin on the surface of the resin formed body, a subsequent step of forming a tin plating layer is not necessary. Accordingly, a porous metal body can be provided at a lower cost. The order of the formation of the metal plating layers formed on the surface of the resin formed body is not limited. Either the nickel plating layer or the chromium plating layer may be first formed.

However, the porous metal body has a nickel content higher than a chromium content. Accordingly, considering the handling of a base after plating, preferably, the nickel plating layer is first formed.

(v) The method for producing a porous metal body described in any one of (i) to (iv) above, in which the electrical conduction treatment or the formation of the tin plating layer is performed so that a content ratio of tin in the porous metal body becomes 17% by mass or more.

By the method for producing a porous metal body described in (v) above, the porous metal body described in (2) above can be produced.

(vi) The method for producing a porous metal body described in any one of (i) to (iv) above, in which the electrical conduction treatment or the formation of the tin plating layer is performed so that a content ratio of tin in the porous metal body becomes less than 17% by mass.

By the method for producing a porous metal body described in (vi) above, the porous metal body described in (3) above can be produced.

DETAILS OF EMBODIMENTS OF THE PRESENT INVENTION

Specific examples of porous metal bodies, etc. according to embodiments of the present invention will be described below. It is intended that the present invention is not limited to these examples, but is determined by appended claims, and includes all variations of the equivalent meanings and ranges to the claims.

<Porous Metal Body>

A porous metal body according to an embodiment of the present invention is a porous metal body having a three-dimensional mesh-like structure and contains nickel, tin, and chromium. The content ratio of the tin is 10% by mass or more and 25% by mass or less, and the content ratio of the chromium is 1% by mass or more and 10% by mass or less. Furthermore, on a cross section of a skeleton of the porous metal body, the porous metal body contains a solid solution phase of chromium, nickel, and tin. The solid solution phase contains a solid solution phase of chromium and trinickel tin ($Ni_3Sn$), the solid solution phase having a chromium content ratio of 2% by mass or less, and does not contain a solid solution phase that is other than a solid solution phase of chromium and trinickel tin ($Ni_3Sn$) and that has a chromium content ratio of less than 1.5% by mass.

In general, nickel and tin form an alloy (NiSn). At a high ratio of tin, trinickel tin ($Ni_3Sn$), which is an intermetallic compound, is formed. Nickel and chromium have a property that they do not form an alloy but form a solid solution in a wide composition. Chromium and tin have a property that they do not form an alloy, and the amount of solid solubility is also small.

Under these properties, the porous metal body according to an embodiment of the present invention contains a plurality of phases having different metal compositions on a cross section of the skeleton and contains at least the following phases (I) to (III). In addition, the total of the areas of (I), (II), and (III) below is preferably 80% or more of the total area of the cross section of the skeleton of the porous metal body.

(I) A solid solution phase of Cr and $Ni_3Sn$, the solid solution phase having a Cr content ratio of 2% by mass or less.

(II) A solid solution phase of Ni, Sn, and Cr, the solid solution phase having a mass ratio (Ni/Sn) of Ni to Sn of 5 to 7 and a Cr content ratio of 1.5% by mass or more and less than 4% by mass.

(III) A solid solution phase of Ni, Sn, and Cr, the solid solution phase having a mass ratio (Ni/Sn) of Ni to Sn of 6 to 8 and a Cr content ratio of 4% by mass or more and 8% by mass or less.

As described above, the porous metal body may intentionally contain components other than Ni, Sn, and Cr or may contain inevitable impurities. However, these components are preferably contained so as not to hinder the total of the areas of the solid solution phases (I) to (III) on the cross section of the skeleton of the porous metal body from becoming 80% or more of the total area of the cross section of the skeleton.

The porous metal body according to an embodiment of the present invention contains, on a cross section of the skeleton, a solid solution phase of chromium, nickel, and tin. The solid solution phase contains a solid solution phase of chromium and trinickel tin ($Ni_3Sn$), the solid solution phase having a chromium content ratio of 2% by mass or less, and does not contain a solid solution phase that is other than a solid solution phase of chromium and trinickel tin ($Ni_3Sn$) and that has a chromium content ratio of less than 1.5% by mass. Therefore, the porous metal body has an advantage of very high corrosion resistance.

The solid solution phase of chromium, nickel, and tin, the solid solution phase having a chromium content ratio of less than 1.5% by mass, has low corrosion resistance. Therefore, the presence of this solid solution phase decreases corrosion resistance of the porous metal body. When the content ratio of tin in the porous metal body is less than 10% by mass, or when the content ratio of chromium in the porous metal body is less than 1% by mass, the effect of improving corrosion resistance of the porous metal body is not obtained. On the other hand, when the content ratio of tin in the porous metal body exceeds 25% by mass, the amount of $Ni_3Sn$ generated is excessively large, and mechanical strength of the porous metal body significantly decreases. When the content ratio of chromium in the porous metal body exceeds 10% by mass, chromium forms an insulating oxide film, and thus the electrical resistance of the porous metal body increases.

The content ratio of tin in the porous metal body is preferably 12% by mass or more and 20% by mass or less.

The content ratio of chromium in the porous metal body is preferably 2% by mass or more and 9% by mass or less.

As described above, the porous metal body contains, on a cross section of the skeleton, a solid solution phase of chromium, nickel, and tin. The solid solution phase contains a solid solution phase of chromium and trinickel tin ($Ni_3Sn$), the solid solution phase having a chromium content ratio of 2% by mass or less, and does not contain a solid solution phase that is other than a solid solution phase of chromium and trinickel tin ($Ni_3Sn$) and that has a chromium content ratio of less than 1.5% by mass. That is, the porous metal body is formed of the solid solution phase (I) of Cr and $Ni_3Sn$ and the solid solution phases (II) and (III) of Ni, Sn, and Cr, and thus has good corrosion resistance. Since $Ni_3Sn$ has better corrosion resistance and better hardness, a porous metal body having better corrosion resistance and better mechanical strength can be obtained by increasing the ratio of the phase of $Ni_3Sn$. Accordingly, when the porous metal body is used in applications that require mechanical strength in addition to corrosion resistance, for example, an oil strap or a catalyst support, on a cross section of the skeleton of the porous metal body, the area ratio of the solid solution phase of chromium and trinickel tin ($Ni_3Sn$), the solid solution phase having a chromium content ratio of 2% by mass or less, is preferably 7% or more and 60% or less of the total area of the cross section of the skeleton.

On the other hand, $Ni_3Sn$ has a property that it has good corrosion resistance and good hardness but is relatively brittle. Therefore, when embrittlement of the skeleton is preferably suppressed rather than further improving corrosion resistance of the porous metal body, it is preferable to reduce the content ratio of $Ni_3Sn$. Accordingly, when the porous metal body is used in applications in which flexibility of the skeleton is necessary and strength to compression and tension is required rather than further improving corrosion resistance, for example, a dust collection filter or a current collector for a fuel cell, on a cross section of the skeleton of the porous metal body, the area ratio of the solid solution phase of chromium and trinickel tin ($Ni_3Sn$), the solid solution phase having a chromium content ratio of 2% by mass or less, is preferably less than 7% of the total area of the cross section of the skeleton.

<Method for Producing Porous Metal Body>

The porous metal body according to an embodiment of the present invention can be produced by various methods. Examples of the production method include the methods described in (4) to (7) and (i) to (vi) above.

The production methods will be described in more detail below.

(Resin Formed Body Having Three-Dimensional Mesh-Like Structure)

The resin formed body having a three-dimensional mesh-like structure is not particularly limited as long as the resin formed body is porous. A known or commercially available resin formed body can be used. Examples thereof that can be used include foamed bodies, non-woven fabrics, felts, and woven fabrics, all of which are formed of a resin. These may be used in combination according to need. The material is not particularly limited, but preferably a material that can be removed by an incineration treatment after being plated with a metal.

From the viewpoint of handling the resin formed body, in particular, in a sheet-like resin formed body, a material having flexibility is preferable because a sheet-like resin formed body having a high rigidity may be broken.

A resin foamed body is preferably used as the resin formed body. Examples of the resin foamed body include urethane foams, styrene foams, and melamine resin foams. Among these, urethane foams are preferable from the viewpoint of particularly high porosity.

The porosity of the resin formed body is not limited but is usually about 60% or more and 97% or less, and preferably about 80% or more and 96% or less. The thickness of the resin formed body is not limited and is appropriately determined in accordance with the use of the porous metal body to be produced. The thickness of the resin formed body is usually about 300 μm or more and 5,000 μm or less, and preferably about 400 μm or more and 2,000 μm or less.

A case where a resin foam is used as the resin formed body having a three-dimensional mesh-like structure will now be described as an example.

(Electrical Conduction Treatment)

The electrical conduction treatment is not particularly limited as long as a layer having electrical conductivity can be provided on a surface of a resin formed body. Examples of the material for forming a layer having electrical conductivity (electrically conductive coating layer) include metals such as nickel, tin, chromium, copper, iron, tungsten, titanium, and stainless steels, and carbon powders.

Specific examples of the electrical conduction treatment preferably include an application of an electrically conductive coating material obtained by adding a binder to a powder of a metal such as nickel, tin, or chromium, or a graphite powder, electroless plating treatments, and gas-phase treatments such as sputtering and vapor deposition/ion plating.

An electroless plating treatment using nickel can be performed by, for example, immersing a resin foam in a known electroless nickel plating bath such as a nickel sulfate aqueous solution containing sodium hypophosphite as a reducing agent. If necessary, before a resin formed body is immersed in a plating bath, the resin formed body may be immersed in, for example, an activation liquid (cleaning liquid manufactured by Japan Kanigen Co., Ltd.) containing a very small amount of palladium ions.

In a sputtering treatment using nickel, tin, or chromium, for example, first, a resin formed body is attached to a substrate holder, and a direct-current voltage is then applied between the holder and a target (nickel, tin, or chromium) while an inert gas is introduced. Thus, ionized inert gas is bombarded onto nickel, tin, or chromium, and sputtered nickel particles, tin particles, or chromium particles are deposited on the surface of the resin formed body.

In the case where an electrically conductive coating material containing a carbon powder, a metal powder, or the like is applied, an example of the method includes applying a mixture of an electrically conductive powder (for example, a powder of a metal material such as a stainless steel, or a powder of carbon such as crystalline graphite or amorphous carbon black) and a binder on a surface of the resin formed body. In this case, a tin powder and a carbon powder may be used. A chromium powder or a chromium oxide powder and a carbon powder may be used. In such a case, when the amounts of the tin powder and the chromium powder or the chromium oxide powder are determined so that the content ratio of tin in the porous metal body is 10% by mass or more and 25% by mass or less and the content ratio of chromium is 1% by mass or more and 10% by mass or less, the subsequent tin plating step or the chromium plating step is not necessary.

When a tin powder, and a chromium powder or a chromium oxide powder are used, considering diffusibility in nickel, a powder having a particle diameter of about 0.1 μm or more and 10 μm or less is preferably used, and a powder having a particle diameter of about 0.5 μm or more and 5 μm or less is more preferably used.

The coating weight (amount of coating) of the electrically conductive coating layer is adjusted such that, in terms of the final metal composition combining with the coating weight of nickel plating, tin plating, or chromium plating performed in a subsequent step, the content ratio of tin in the porous metal body becomes 10% by mass or more and 25% by mass or less, and the content ratio of chromium in the porous metal body becomes 1% by mass or more and 10% by mass or less.

When nickel is used in the electrically conductive coating layer, it is sufficient that the coating layer is continuously formed on the surface of the resin formed body, and the coating weight is not limited. However, the coating weight is usually about 5 $g/m^2$ or more and 15 $g/m^2$ or less, and preferably about 7 $g/m^2$ or more and 10 $g/m^2$ or less.

(Formation of Nickel Plating Layer)

A nickel plating layer may be formed by using electroless nickel plating or electrolytic nickel plating. However, electrolytic nickel plating is preferable because of its good efficiency. An electrolytic nickel plating treatment may be performed in accordance with an ordinary method. A plating bath used in the electrolytic nickel plating treatment may be a known or commercially available plating bath. Examples of the plating bath include the Watts bath, a chloride bath, and a sulfamate bath.

A resin structure in which an electrically conductive layer is formed on a surface thereof by the electroless plating or sputtering is immersed in a plating bath. The resin structure is connected to a cathode, and a nickel counter electrode plate is connected to an anode. A direct current or a pulse interrupted current is applied in this state. Thus, a nickel coating can be further formed on the electrically conductive layer.

The coating weight of the electrolytic nickel plating layer is adjusted such that, in terms of the final metal composition of the porous metal body, the content ratio of chromium becomes 1% by mass or more and 10% by mass or less, and the content ratio of tin becomes 10% by mass or more and 25% by mass or less.

(Formation of Tin Plating Layer)

A step of forming a tin plating layer on a resin structure can be performed, for example, as follows. Specifically, a plating bath having a composition containing 55 g/L of stannous sulfate, 100 g/L of sulfuric acid, 100 g/L of cresol sulfonic acid, 2 g/L of gelatin, and 1 g/L of β-naphthol is prepared as a sulfate bath. A tin plating layer can be formed at a cathode current density of 2 A/dm$^2$ and an anode current density of 1 A/dm$^2$ or less, at a temperature of 20° C., and under stirring (cathode rocking) at 2 m/min.

The coating weight of the tin plating is adjusted such that, in terms of the final metal composition of the porous metal body, the content ratio of chromium becomes 1% by mass or more and 10% by mass or less, and the content ratio of tin becomes 10% by mass or more and 25% by mass or less.

In order that, on a cross section of the skeleton of the porous metal body, the area ratio of the solid solution phase of chromium and trinickel tin ($Ni_3Sn$), the solid solution phase having a chromium content ratio of 2% by mass or less, becomes 7% or more and 60% or less of the total area of the cross section of the skeleton, the tin plating layer is formed so that the content ratio of tin in the porous metal body becomes 17% by mass or more.

On the other hand, in order that, on a cross section of the skeleton of the porous metal body, the area ratio of the solid solution phase of chromium and trinickel tin ($Ni_3Sn$), the solid solution phase having a chromium content ratio of 2% by mass or less, becomes less than 7% of the total area of the cross section of the skeleton, the tin plating layer is formed so that the content ratio of tin in the porous metal body becomes less than 17% by mass.

In order to improve the adhesiveness of tin plating, preferably, immediately before the tin plating, strike nickel plating is performed to remove a surface oxidation film of the porous metal body, and the porous metal body is immersed in a tin plating solution while being wet without drying. Thus, the adhesiveness of the plating layer can be enhanced.

Conditions for the strike nickel plating can be determined, for example, as follows. Specifically, a plating bath having a composition containing 240 g/L of nickel chloride and 125 ml/L of hydrochloric acid (having a specific gravity of about 1.18) is prepared as a Wood's strike nickel bath. The strike nickel plating can be performed at room temperature using nickel or carbon as an anode.

The plating procedure described above is summarized as follows. Degreasing with Ace Clean (cathode electrolytic degreasing, 5 A/dm$^2$×1 min), washing with hot water, washing with water, activation with an acid (immersion in hydrochloric acid for 1 minute), Wood's strike nickel plating treatment (5 to 10 A/dm$^2$×1 min), tin plating treatment after washing without drying, washing with water, and drying are performed in that order.

(Formation of Chromium Plating Layer)

A step of forming a chromium plating layer on a resin structure can be performed, for example, as follows. Specifically, the step may be performed in accordance with a known chromium plating method. A known or commercially available plating bath can be used. For example, a hexavalent chromium bath or a trivalent chromium bath can be used. A porous body to be subjected to plating is immersed in the chromium plating bath and connected to a cathode. A chromium plate serving as a counter electrode is connected to an anode. A direct current or a pulse interrupted current is applied in this state. Thus, a chromium plating layer can be formed.

The coating weight of the chromium plating is adjusted such that, in terms of the final metal composition of the porous metal body, the content ratio of chromium becomes 1% by mass or more and 10% by mass or less, and the content ratio of tin becomes 10% by mass or more and 25% by mass or less.

(Circulation of Plating Solution During Plating)

In plating on a base such as a resin formed body having a three-dimensional mesh-like structure, it is usually difficult to perform plating inside uniformly. In order to prevent the inside from non-coating and to reduce the difference in the amount of coating of plating between the inside and the outside, the plating solution is preferably circulated. Examples of the circulation method include a method using a pump, and a method in which a fan is provided inside a plating tank. By using any of these methods, a plating solution may be sprayed onto a resin formed body, or a resin formed body may be arranged to be adjacent to a suction opening. This method is effective because a flow of the plating solution is easily formed inside the resin formed body.

(Removal of Resin Formed Body)

Examples of a method for removing a resin formed body used as a base from the resin structure in which metal plating layers have been formed on the surface thereof include, but are not limited to, a treatment with a chemical agent, and a method including combustion removing by incineration. In the case of the incineration, for example, heating is performed in an oxidizing atmosphere such as air at about 600° C. or more.

The resulting porous metal body is heat-treated in a reducing atmosphere to reduce metal, thereby obtaining a porous metal body containing nickel, tin, and chromium.

(Step of Diffusing Nickel, Tin, and Chromium)

If no treatment is further performed after the metal plating, most part of the surface of the skeleton of the porous metal body may be formed of nickel. Accordingly, it is necessary to perform heat treatment to diffuse a nickel component, a tin component, and a chromium component. The diffusion of the nickel component, the tin component, and the chromium component can be performed in an inert atmosphere (under reduced pressure or in nitrogen, argon, or the like) or a reducing atmosphere (hydrogen).

When the heat treatment temperature is excessively low, it takes a long time to perform the diffusion. When the heat treatment temperature is excessively high, the porous metal body may be softened and the porous body structure may be impaired under its own weight in some content ratios of tin and chromium. Therefore, the heat treatment temperature is preferably in the range of 1,100° C. or more and 1,250° C. or less. The heat treatment temperature is more preferably 1,100° C. or more and 1,200° C. or less, and still more preferably 1,100° C. or more and 1,150° C. or less.

The heat treatment time is 5 minutes or more. In order to achieve uniform diffusion, the heat treatment time is preferably 15 minutes or more, and more preferably 30 minutes or more.

(Cooling Step)

The method for producing a porous metal body according to an embodiment of the present invention includes a step of performing cooling at a rate of higher than 30° C./min until a temperature of the porous metal body after the heat treatment becomes at least 550° C. or less.

Hitherto, in the production of a porous metal body containing two or more metal components, after the metal components are diffused by performing heat treatment, the porous metal body is returned to room temperature by slow cooling without performing rapid cooling. However, as a result of intensive studies, the inventors of the present invention found that, in a porous metal body containing nickel, tin, and chromium, unless the porous metal body is rapidly cooled after the metal component are diffused by heat treatment, a solid solution phase of chromium, nickel, and tin, the solid solution phase having a chromium content ratio of less than 1.5% by mass, is formed in a large amount. It is believed that this is due to the following mechanism.

Specifically, when the heat treatment is performed at a temperature of 1,100° C. or more, tin first diffuses in nickel and chromium subsequently diffuses. With the progress of this diffusion of chromium, tin portions that cannot form a solid solution gather and form $Ni_3Sn$ with peripheral nickel. When the porous metal body is slowly cooled after the heat treatment, a high-temperature phase of $Ni_3Sn$ is separated into a low-temperature phase of $Ni_3Sn$ and a phase of NiSn in a stripe shape. It is believed that, as a result, the solid solution phase of chromium, nickel, and tin, the solid solution phase having a chromium content ratio of less than 1.5% by mass, appears in a large amount. In contrast, when the porous metal body is rapidly cooled after the heat treatment, the high-temperature phase of $Ni_3Sn$ is cooled and fixed before being separated into the low-temperature phase and the NiSn phase. Therefore, it is believed that the solid solution phase of chromium, nickel, and tin, the solid solution phase having a chromium content ratio of less than 1.5% by mass, is not formed.

From the above viewpoint, the cooling rate is preferably as high as possible. It is sufficient that the cooling rate is higher than 30° C./min. During the heat treatment, the temperature of the porous metal body is about 1,100° C. to 1,250° C. However, as long as the rapid cooling is performed down to a temperature at which the high-temperature phase of $Ni_3Sn$ is not separated into the low-temperature phase and the NiSn phase, the subsequent cooling may be slow cooling. For this reason, it is sufficient that cooling at a rate of higher than 30° C./min is performed until the temperature of the porous metal body becomes 550° C. or less. Even after the temperature of the porous metal body becomes 550° C. or less, rapid cooling may be continued at a rate of higher than 30° C./min.

(Metal Coating Weight)

The total of the metal coating weights after the electrically conductive coating layer, the nickel plating layer, the tin plating layer, and the chromium plating layer are formed may be appropriately changed in accordance with the use of the porous metal body, but is preferably, for example, 200 g/m² or more and 2,000 g/m² or less. The total of the metal coating weights is more preferably 300 g/m² or more and 1,200 g/m² or less, and still more preferably 400 g/m² or more and 1,000 g/m² or less. When the total of the metal coating weights is 200 g/m² or more, the porous metal body can have sufficient strength. When the total of the metal coating weights is 2,000 g/m² or less, an increase in the production cost can be suppressed.

(Cell Size)

An average cell size of the porous metal body may be appropriately changed in accordance with the use of the porous metal body, but is preferably, for example, 150 μm or more and 1,000 μm or less. The average cell size is more preferably 300 μm or more and 700 μm or less, and still more preferably 350 μm or more and 600 μm or less. When the porous metal body is used as other current collectors, the average cell size of the porous metal body is preferably 150 μm or more and 1,000 μm or less. The average cell size is more preferably 200 μm or more and 700 μm or less, and still more preferably 300 μm or more and 600 μm or less.

The average cell size is a value determined from the reciprocal of the number of cells of the porous metal body. The number of cells is a numerical value determined by counting the number of cells intersecting a line having a length of 1 inch, the cells being dispose on the outermost surface, when the line is drawn on a surface of the porous metal body. The number of cells is represented in units of cells/inch, where 1 inch is assumed to be 2.54 centimeters.

(Determination of Composition of Porous Metal Body)

The mass percent of each of the contained elements can be determined by performing a quantitative measurement using inductively coupled plasma (ICP).

(Determination of Diffusion of Tin and Chromium)

A diffusion state of tin and chromium can be determined by EDX of a cross section of a porous metal body, and comparing a spectrum on the front side of the skeleton with a spectrum on the inner side of the skeleton.

(Measurement of Area Ratio of Each Phase on Cross Section of Skeleton of Porous Metal Body)

The area ratio can be evaluated by observing a cross section of a porous metal body with a SEM to obtain a photograph, and performing an image processing of the photograph as follows.

In a backscattered electron image of the SEM, only a solid solution phase with $Ni_3Sn$ strongly appears white. The concentrations of Ni, Sn, and Cr are determined by EDX mapping. The solid solution phase of $Ni_3Sn$ and other phases can be separated from each other on the basis of the amount of Sn.

The area ratio is determined as follows. First, in a backscattered electron image of the SEM, the threshold of black/white binarization is selected so that a portion displayed as white corresponds to a region of $Ni_3Sn$ determined by EDX. The area of white is calculated as the number of counts. Subsequently, in the same backscattered electron image of the SEM, the threshold of black/white binarization is selected so that the whole of the skeleton is displayed as white. The area of the whole skeleton is calculated as the number of counts. The ratio of the solid solution phase of Cr and $Ni_3Sn$ to the total of the cross section of the skeleton can be calculated from a ratio of the two results.

(Determination of Respective Solid Solution Phases)

As in the above method, first, the concentrations of Ni, Sn, and Cr are determined by EDX to determine phases in which $Ni_3Sn$ is not generated. Subsequently, in each of the phases, the ratio of Ni to Sn and the amount of Cr contained in the phase are determined. Thus, it is possible to distinguish whether the phase is the phase having a Cr content ratio of less than 1.5% mass or one of the phases described in (II) and (III) above.

EXAMPLES

The present invention will be described in more detail by using Examples. However, these Examples are illustrative and porous metal bodies, etc. of the present invention are not limited thereto. The scope of the present invention is determined by appended claims, and includes all variations of the equivalent meanings and ranges to the claims.

Examples of the present invention can be used in current collectors of batteries, capacitors, fuel cells, or the like. Furthermore, Examples of the present invention can be widely used in applications that require corrosion resistance, for example, heat storage materials, dust collection filters in a furnace having an atmosphere of a high temperature, electrodes of various electrochemical devices (examples: electrodes of a plating apparatus, electrode of batteries, etc.), and catalyst supports.

Example 1

—Porous Metal Body 1—
(Electrical Conduction Treatment of Resin Formed Body Having Three-Dimensional Mesh-Like Structure)

A polyurethane sheet having a thickness of 1.0 mm (the number of cells: 50 to 54/inch, average cell size: 510 μm, porosity: 96% by volume) was used as a resin formed body having a three-dimensional mesh-like structure. In order to impart electrical conductivity to a surface of this polyurethane sheet, an electrically conductive coating material was prepared by dispersing 50 g of a chromium oxide powder having a particle diameter of 3 μm and 100 g of a graphite powder having a particle diameter of 5 μm in 0.5 L of a 10% aqueous solution of an acrylic acid ester resin. The polyurethane sheet was continuously immersed in the coating material, squeezed by rolls, and then dried to perform an electrical conduction treatment on the polyurethane sheet. Thus, an electrically conductive coating layer was formed on the surface of the polyurethane sheet (sheet-like resin formed body having a three-dimensional mesh-like structure).

(Nickel Plating)

The polyurethane sheet whose surface had been subjected to the electrical conduction treatment as described above was plated with nickel at a coating weight of 361 g/m² to form a nickel plating layer. A nickel sulfamate plating solution was used as a plating solution. The sulfamate bath was an aqueous solution having concentrations of 450 g/L of nickel sulfamate and 30 g/L of boric acid. The pH of the sulfamate bath was adjusted to 4. Nickel plating was performed at a temperature of 55° C. at a current density of 20 ASD (A/dm²). Consequently, a resin structure containing nickel was obtained.

(Tin Plating)

The surface of the above-prepared resin structure containing nickel was plated with tin at a coating weight of 85.5 g/m² to form a tin plating layer. A tin plating solution having a composition containing 55 g/L of stannous sulfate, 100 g/L of sulfuric acid, 100 g/L of cresol sulfonic acid, 2 g/L of gelatin, and 1 g/L of β-naphthol relative to 1,000 g of water was used. The bath temperature of the plating bath was 20° C., and an anode current density was 1 A/dm². The plating solution was stirred by cathode rocking so that the rate became 2 m/min.

(Removal of Resin Formed Body and Diffusion of Metals)

The resin structure containing nickel, tin, and chromium was heated in air at 800° C. for 5 minutes to remove the base (polyurethane sheet) by incineration. At this time, the porous metal body is also partially oxidized. Therefore, reduction and diffusion treatments were then further performed in a reducing (hydrogen) atmosphere at 1,100° C. for 30 minutes.

(Cooling of Porous Metal Body)

The porous metal body after the heat treatment was cooled at a rate of 90° C./min until the temperature of the porous metal body became 550° C. to produce Porous metal body 1.

Example 2 to Example 5

—Porous Metal Bodies 2 to 5—

Porous metal body 2 to Porous metal body 5 were produced as in Porous metal body 1 except that, in the production of Porous metal body 1, the amount of coating of the chromium oxide powder, the coating weight of nickel plating, and the coating weight of tin plating were changed as shown in Table 1 below.

Comparative Example 1

—Porous Metal Body 6—

Porous metal body 6 was produced as in Porous metal body 1 except that, in the production of Porous metal body 1, the amount of coating of the chromium oxide powder, the coating weight of nickel plating, and the coating weight of tin plating were changed as shown in Table 1 below, and the cooling rate of the porous metal body after the heat treatment was changed to 30° C./min.

Comparative Example 2 to Comparative Example 5

—Porous Metal Bodies 7 to 10—

Porous metal body 7 to Porous metal body 10 were produced as in Porous metal body 1 except that, in the production of Porous metal body 1, the amount of coating of the chromium oxide powder, the coating weight of nickel plating, and the coating weight of tin plating were changed as shown in Table 1 below.

Example 6 to Example 10

—Porous Metal Bodies 11 to 15—

Porous metal body 11 to Porous metal body 15 were produced as in Porous metal body 1 except that, in the production of Porous metal body 1, the amount of coating of the chromium oxide powder, the coating weight of nickel plating, and the coating weight of tin plating were changed as shown in Table 1 below, and the heat treatment time at 1,100° C. was changed to 5 minutes.

TABLE 1

| | Ni coating weight (g/m²) | Sn coating weight (g/m²) | Cr coating weight (g/m²) | Sn mass ratio (mass %) | Cr mass ratio (mass %) |
|---|---|---|---|---|---|
| Porous metal body 1 | 361.0 | 85.5 | 28.5 | 18 | 6 |
| Porous metal body 2 | 349.5 | 134.4 | 53.8 | 25 | 10 |
| Porous metal body 3 | 360.7 | 121.9 | 4.9 | 25 | 1 |
| Porous metal body 4 | 365.3 | 45.7 | 45.7 | 10 | 10 |
| Porous metal body 5 | 349.5 | 39.3 | 3.9 | 10 | 1 |
| Porous metal body 6 | 355.1 | 84.1 | 28.0 | 18 | 6 |
| Porous metal body 7 | 364.6 | 139.4 | 32.2 | 26 | 6 |
| Porous metal body 8 | 358.5 | 38.0 | 25.3 | 9 | 6 |
| Porous metal body 9 | 345.2 | 87.5 | 53.5 | 18 | 11 |
| Porous metal body 10 | 348.2 | 76.9 | 2.1 | 18 | 0.5 |
| Porous metal body 11 | 367.0 | 86.9 | 29.0 | 18 | 6 |
| Porous metal body 12 | 347.3 | 133.6 | 53.4 | 25 | 10 |
| Porous metal body 13 | 359.0 | 121.3 | 4.9 | 25 | 1 |
| Porous metal body 14 | 356.9 | 44.6 | 44.6 | 10 | 10 |
| Porous metal body 15 | 344.2 | 38.7 | 3.9 | 10 | 1 |

<Evaluation of Porous Metal Body>
(Area Ratio)

A cross section of the skeleton of each of Porous metal bodies 1 to 15 was observed by SEM-EDX. A phase of $Ni_3Sn$ and other phases are separated from each other on the basis of the ratio of Sn. The area ratio was determined by image processing.

The amounts of Ni, Sn, and Cr in each phase were measured in points at three positions by point EDX analysis of the cross section. According to the results, it was confirmed that the skeleton was separated into (I) a solid solution phase of Cr and $Ni_3Sn$, the solid solution phase having a Cr content ratio of 2% by mass or less, (II) a solid solution phase of Ni, Sn, and Cr, the solid solution phase having a mass ratio (Ni/Sn) of Ni to Sn of 5 to 7 and a Cr content ratio of 1.5% by mass or more and less than 4% by mass, and (III) a solid solution phase of Ni, Sn, and Cr, the solid solution phase having a mass ratio (Ni/Sn) of Ni to Sn of 6 to 8 and a Cr content ratio of 4% by mass or more and 8% by mass or less.

On the cross section of the skeleton of Porous metal body 6, besides the solid solution phase of chromium and trinickel tin ($Ni_3Sn$), the solid solution phase having a Cr content ratio of 2% by mass or less, a solid solution phase of Ni, Sn, and Cr, the solid solution phase having a Cr content ratio of less than 1.5% by mass, was confirmed. Table 2 shows the results.

(Corrosion Resistance)

Porous metal bodies 1 to 15 were each immersed in a 10% aqueous sodium sulfate solution whose pH had been adjusted to 3 with sulfuric acid, and a potential of 0.8 V was applied for one hour. The amount of Ni released in this case was examined to evaluate corrosion resistance of each of the porous metal bodies. The amount of Ni release was determined by ICP analysis of the liquid used in the test. Table 2 shows the results.

The corrosion resistance of the porous metal body is evaluated as follows. An amount of Ni release of less than 10 ppm is evaluated as faire. An amount of Ni release of 5 ppm or less is evaluated as good. An amount of Ni release of 3 ppm or less is evaluated as excellent.

Although Porous metal body 7 had excellent corrosion resistance, the skeleton thereof was significantly embrittled and Porous metal body 7 could not be used as a porous metal body. Although Porous metal body 9 had excellent corrosion resistance, the electrical resistance thereof was very high because the chromium content ratio was excessively high. Therefore, Porous metal body 9 was not suitable for applications having electrical properties, for example, a current collector.

(Observation of Cross Section of Skeleton)

—Porous Metal Body 1—

FIG. 1 shows a photograph of results obtained when SEM observation and EDX analysis of a cross section of the skeleton of Porous metal body 1 were performed. The magnification of the photograph of FIG. 1 is 800. The types of phases present in the porous metal body were examined by determining the element concentrations of Ni, Sn, and Cr in each phase while specifying the interface of respective phases on the basis of the difference in contrast on the photograph. The point analysis by EDX was performed in points at three positions selected in each phase. Three positions, namely, both end portions of Porous metal body 1 in the thickness direction and a middle portion between the end portions were selected for the cross sections of the porous metal body.

As shown in the photograph in FIG. 1, it was confirmed that a solid solution phase of Ni, Sn, and Cr, the solid solution phase having a Cr content ratio of less than 1.5% by mass, was not present in Porous metal body 1. In the photograph of FIG. 1, the light gray portion represents (I) a solid solution phase of Cr and $Ni_3Sn$, the solid solution phase having a Cr content ratio of 2% by mass or less. The dark gray portion that is separated into several portions represents (II) a solid solution phase of Ni, Sn, and Cr, the solid solution phase having a mass ratio (Ni/Sn) of Ni to Sn of 5 to 7 and a Cr content ratio of 1.5% by mass or more and less than 4% by mass, and (III) a solid solution phase of Ni, Sn, and Cr, the solid solution phase having a mass ratio (Ni/Sn) of Ni to Sn of 6 to 8 and a Cr content ratio of 4% by mass or more and 8% by mass or less. The black portion represents a hollow portion.

—Porous Metal Body 6—

Figure 2:
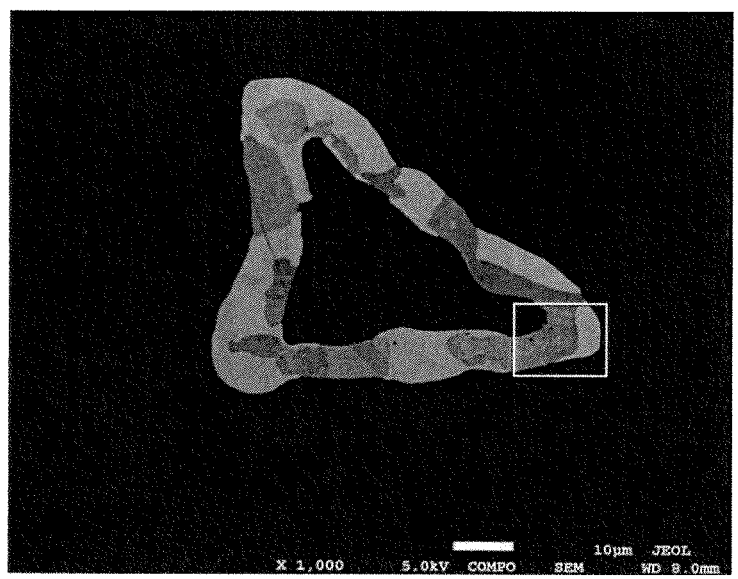
FIG. 2 is a view showing a photograph of results of SEM-EDX analysis for a cross section of a skeleton of Porous metal body 6 of a Comparative Example.

FIG. 2 shows a photograph of results obtained when SEM observation and EDX analysis of a cross section of the skeleton of Porous metal body 6 were performed as in Porous metal body 1. The types of phases present in the porous metal body were examined by determining the element concentrations of Ni, Sn, and Cr in each phase while specifying the interface of respective phases on the basis of the difference in contrast on the photograph. The point analysis by EDX was performed in points at three positions selected in each phase. Three positions, namely, both end portions of Porous metal body 1 in the thickness direction and a middle portion between the end portions were selected for the cross sections of the porous metal body.

Figure 3:
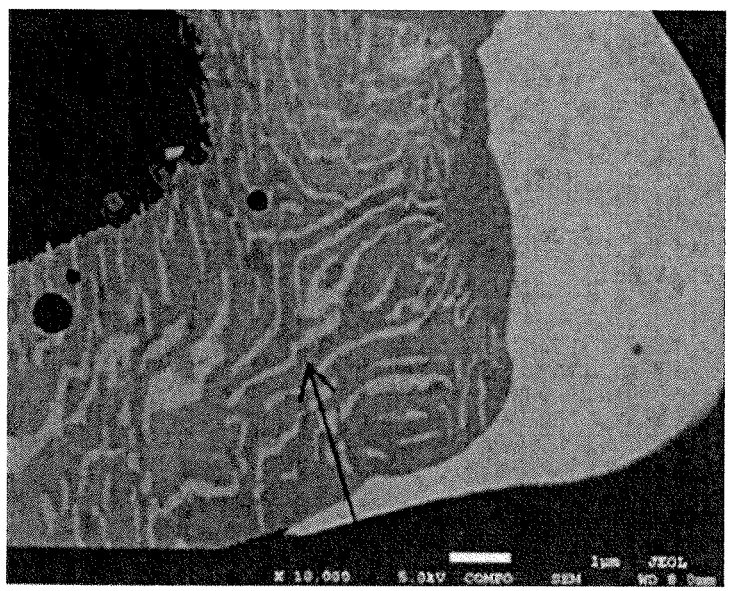
FIG. 3 is a view showing an enlarged photograph of the portion surrounded by the rectangular frame in FIG. 2.

The magnification of the photograph of FIG. 2 is 1,000. A stripe-like structure was observed in a lower right portion of the photograph of FIG. 2. FIG. 3 is an enlarged photograph of the portion surrounded by the rectangular frame in FIG. 2. The magnification of the photograph of FIG. 3 is 10,000.

As shown in the portion denoted by the arrow in FIG. 3, it was confirmed that Porous metal body 6 has a portion where the solid solution phase of Cr and $Ni_3Sn$, the solid solution phase having a Cr content ratio of 2% by mass or less, and a solid solution phase of Cr, Ni, and Sn, the solid solution phase having a Cr content ratio of less than 1.5% by mass form a striped, layered structure.

In the photograph of FIG. 2, the light gray portion represents the (I) solid solution phase of Cr and $Ni_3Sn$, the solid solution phase having a Cr content ratio of 2% by mass or less. The dark gray portion represents the (II) solid solution phase of Ni, Sn, and Cr, the solid solution phase having a mass ratio (Ni/Sn) of Ni to Sn of 5 to 7 and a Cr content ratio of 1.5% by mass or more and less than 4% by mass, and the (III) solid solution phase of Ni, Sn, and Cr, the solid solution phase having a mass ratio (Ni/Sn) of Ni to Sn of 6 to 8 and a Cr content ratio of 4% by mass or more and 8% by mass or less. The black portion represents a hollow portion.

Furthermore, in the photograph of FIG. 3, the light gray portion represents the (I) phase of Cr and $Ni_3Sn$, and the dark gray portion represents a solid solution phase of Cr, Ni, and Sn, the solid solution phase having a Cr content ratio of less than 1.5% by mass. The black portion represents a hollow portion.

TABLE 2

|  | Area ratio (%) of Cr, Ni₃Sn solid solution phase having Cr content of 2 mass % or less | Amount of Ni release (ppm) | Presence or absence of Ni, Sn, Cr solid solution phase having Cr content of less than 1.5 mass % | Cooling rate |
|---|---|---|---|---|
| Porous metal body 1 | 24 | 3.1 | Absent | 90° C./min |
| Porous metal body 2 | 20 | 1.9 | Absent | 90° C./min |
| Porous metal body 3 | 22 | 3.8 | Absent | 90° C./min |
| Porous metal body 4 | 0.8 | 2.1 | Absent | 90° C./min |
| Porous metal body 5 | 1.1 | 3.3 | Absent | 90° C./min |
| Porous metal body 6 | 14 | 21 | Present | 30° C./min |
| Porous metal body 7 | 62 | 4.4 | Absent | 90° C./min |
| Porous metal body 8 | 0.5 | 13 | Absent | 90° C./min |
| Porous metal body 9 | 25 | 2.9 | Absent | 90° C./min |
| Porous metal body 10 | 28 | 33 | Absent | 90° C./min |
| Porous metal body 11 | 13 | 5.0 | Absent | 90° C./min |
| Porous metal body 12 | 8 | 3.0 | Absent | 90° C./min |
| Porous metal body 13 | 9 | 6.1 | Absent | 90° C./min |
| Porous metal body 14 | 0.4 | 3.4 | Absent | 90° C./min |
| Porous metal body 15 | 0.7 | 5.3 | Absent | 90° C./min |

The invention claimed is:

1. A porous metal body having a three-dimensional mesh-like structure, the porous metal body comprising nickel (Ni), tin (Sn), and chromium (Cr),
wherein a content ratio of the tin is 10% by mass or more and 25% by mass or less,
a content ratio of the chromium is 1% by mass or more and 10% by mass or less,
on a cross section of a skeleton of the porous metal body, the porous metal body contains a solid solution phase of chromium, nickel, and tin, and the solid solution phase
contains a solid solution phase of chromium and trinickel tin (Ni₃Sn), the solid solution phase having a chromium content ratio of 2% by mass or less, and
does not contain a solid solution phase that is other than a solid solution phase of chromium and trinickel tin (Ni₃Sn) and that has a chromium content ratio of less than 1.5% by mass.

2. The porous metal body according to claim 1, wherein, on the cross section of the skeleton of the porous metal body, an area ratio of the solid solution phase of chromium and trinickel tin (Ni₃Sn), the solid solution phase having a chromium content ratio of 2% by mass or less, is 7% or more and 60% or less of a total area of the cross section of the skeleton.

3. The porous metal body according to claim 1, wherein, on the cross section of the skeleton of the porous metal body, an area ratio of the solid solution phase of chromium and trinickel tin (Ni₃Sn), the solid solution phase having a chromium content ratio of 2% by mass or less, is less than 7% of a total area of the cross section of the skeleton.

4. A method for producing a porous metal body having a three-dimensional mesh-like structure and containing nickel (Ni), tin (Sn), and chromium (Cr), the method comprising:
a step of subjecting a surface of a resin formed body having a three-dimensional mesh-like structure to an electrical conduction treatment by applying a conductivity-imparting material containing a chromium powder or a chromium oxide powder onto the surface of the resin formed body so that a content ratio of chromium in the porous metal body becomes 1% by mass or more and 10% by mass or less;
a step of forming a resin structure by forming a nickel plating layer and a tin plating layer on the resin formed body so that a content ratio of tin in the porous metal body becomes 10% by mass or more and 25% by mass or less;
a step of diffusing the chromium, the nickel, and the tin by heat-treating the resin structure at 1,100° C. or more for 5 minutes or more; and
a step of performing cooling at a rate of higher than 30° C./min until a temperature of the porous metal body after the heat treatment becomes at least 550° C. or less.

5. A method for producing a porous metal body having a three-dimensional mesh-like structure and containing nickel (Ni), tin (Sn), and chromium (Cr), the method comprising:
a step of subjecting a surface of a resin formed body having a three-dimensional mesh-like structure to an electrical conduction treatment;
a step of forming a resin structure by forming a nickel plating layer, a tin plating layer, and a chromium plating layer on the resin formed body so that a content ratio of tin in the porous metal body becomes 10% by mass or more and 25% by mass or less and a content ratio of chromium in the porous metal body becomes 1% by mass or more and 10% by mass or less;
a step of diffusing the nickel, the tin, and the chromium by heat-treating the resin structure at 1,100° C. or more for 5 minutes or more; and
a step of performing cooling at a rate of higher than 30° C./min until a temperature of the porous metal body after the heat treatment becomes at least 550° C. or less.

6. The method for producing a porous metal body according to claim 4, wherein, in the formation of the tin plating layer, the tin plating layer is formed so that a content ratio of tin in the porous metal body becomes 17% by mass or more.

7. The method for producing a porous metal body according to claim 4, wherein, in the formation of the tin plating layer, the tin plating layer is formed so that a content ratio of tin in the porous metal body becomes less than 17% by mass.

8. The method for producing a porous metal body according to claim 5, wherein, in the formation of the tin plating layer, the tin plating layer is formed so that a content ratio of tin in the porous metal body becomes 17% by mass or more.

9. The method for producing a porous metal body according to claim 5, wherein, in the formation of the tin plating layer, the tin plating layer is formed so that a content ratio of tin in the porous metal body becomes less than 17% by mass.

* * * * *